United States Patent
Chen et al.

(10) Patent No.: US 8,056,614 B2
(45) Date of Patent: Nov. 15, 2011

(54) HEAT SINK AND MODULAR HEAT SINK

(75) Inventors: Yu-Chu Chen, Taipei (TW); Ching Ho, Taipei (TW)

(73) Assignee: AMA Precision Inc., Taipei (TW)

( * ) Notice: Subject to any disclaimer, the term of this patent is extended or adjusted under 35 U.S.C. 154(b) by 769 days.

(21) Appl. No.: 12/132,630

(22) Filed: Jun. 4, 2008

(65) Prior Publication Data
US 2008/0302509 A1    Dec. 11, 2008

(30) Foreign Application Priority Data
Jun. 8, 2007   (TW) .............................. 96120699 A

(51) Int. Cl.
*F28F 7/00*   (2006.01)
*H05K 7/20*   (2006.01)
(52) U.S. Cl. .......................................... 165/80.3; 165/78
(58) Field of Classification Search ................. 165/80.3, 165/185, 78, 79, 76; 361/709, 710, 697; 174/16.3
See application file for complete search history.

(56) References Cited

U.S. PATENT DOCUMENTS

| | | | | |
|---|---|---|---|---|
| 999,334 A | * | 8/1911 | Pearson | 405/281 |
| 2,434,676 A | * | 1/1948 | Spender | 165/182 |
| 3,312,277 A | * | 4/1967 | Chitouras et al. | 165/185 |
| 4,669,535 A | * | 6/1987 | Seidler | 165/78 |
| 4,734,139 A | * | 3/1988 | Shakun et al. | 136/210 |
| 5,419,041 A | * | 5/1995 | Ozeki | 29/890.03 |
| 5,586,004 A | * | 12/1996 | Green et al. | 361/699 |
| 5,775,410 A | * | 7/1998 | Ramm-Schmidt et al. | 165/110 |
| 6,053,666 A | * | 4/2000 | Irvine et al. | 405/279 |
| 6,279,648 B1 | * | 8/2001 | Diels et al. | 165/80.3 |
| 6,708,757 B2 | * | 3/2004 | Hebel et al. | 165/80.3 |

FOREIGN PATENT DOCUMENTS

| | | |
|---|---|---|
| CN | 2467998 | 12/2001 |
| CN | 2536370 | 2/2003 |
| CN | 2624271 | 7/2004 |
| EP | 867937 A2 * | 9/1998 |
| TW | M250437 | 11/2004 |

OTHER PUBLICATIONS

"1st Office Action of China counterpart application", issued on Sep. 4, 2009, p. 1-p. 5.

* cited by examiner

*Primary Examiner* — Tho V Duong
(74) *Attorney, Agent, or Firm* — J.C. Patents

(57) ABSTRACT

A modular heat sink including a first heat sink and a second heat sink is disclosed. The first heat sink includes a first base having a female connecting part and a first fin assembly disposed on the first base. The second heat sink is connected to the first heat sink and includes a second base having a male connecting part for coupling the female connecting part and a second fin assembly disposed on the second base. The male connecting part is coupled with the female connecting part.

9 Claims, 6 Drawing Sheets

HEAT SINK AND MODULAR HEAT SINK

CROSS-REFERENCE TO RELATED APPLICATION

This application claims the priority benefit of Taiwan application serial no. 96120699, filed on Jun. 8, 2007. The entirety of the above-mentioned patent application is hereby incorporated by reference herein and made a part of specification.

BACKGROUND OF THE INVENTION

1. Field of the Invention

The invention relates to a heat sink and, more particularly, to a modular heat sink.

2. Description of the Related Art

With the progress of the semiconductor technology, the size of the display tends to be large. The flat panel display such as the household liquid crystal display (LCD) and plasma display panel (PDP) and the light emitting diode (LED) display applied to the large outdoor billboard are common displays.

Taking the large outdoor billboard as example, on the basis of the condition that the problem of signal delay is not absolutely solved and the consideration for the cost, a common large outdoor billboard is usually composed of a plurality of small LCDs, PDPs or LED displays. Taking the LED display as example, the LED display is composed of a plurality of LED modules arranged in array to obtain the needed size.

Under the limitation of the size and the heat dissipation effect of the heat sink, only a small LED module cooperates with one or a plurality of heat sinks nowadays. However, when a plurality of small LED modules are connected together and form a large LED display, the small LED modules at the periphery of the LED display contact the cold environment and have good heat dissipation effect. Relatively, the small LED modules at the center of the LED display have a bad heat dissipation effect.

BRIEF SUMMARY OF THE INVENTION

The invention provides a heat sink which may be modular heat sink.

The invention provides a modular heat sink with different size obtained by assembling according to the need of the user.

The invention provides a heat sink including a base and a fin assembly. A female connecting part and a male connecting part for coupling with the female connecting part are provided at two sides of the base, and the fin assembly is disposed at the base.

In one embodiment of the invention, the inner side of the female connecting part has a first positioning portion, and the outer side of the male connecting part has a second positioning portion. The first positioning portion is corresponding to the second positioning portion.

In one embodiment of the invention, the first positioning portion is a dome, and the second positioning portion is a recess.

In one embodiment of the invention, the first positioning portion is a recess, and the second positioning portion is a dome.

In one embodiment of the invention, the base and the fin assembly are integrally formed.

In one embodiment of the invention, the female connecting part further has a plurality of first positioning holes passing through the female connecting part.

In one embodiment of the invention, the male connecting part further has a plurality of second positioning holes passing through the male connecting part and corresponding to the first positioning holes.

The invention further provides a modular heat sink including a first heat sink and a second heat sink. The first heat sink includes a first base and a first fin assembly disposed at the first base. The base has a female connecting part. The second heat sink is connected to the first heat sink, and it includes a second base and a second fin assembly disposed at the second base. The base has a male connecting part coupled with the female connecting part.

In one embodiment of the invention, the inner side of the female connecting part has a first positioning portion, and the outer side of the male connecting part has a second positioning portion corresponding to the first positioning portion.

In one embodiment of the invention, the first positioning portion is a dome, and the second positioning portion is a recess.

In one embodiment of the invention, the first positioning portion is a recess, and the second positioning portion is a dome.

In one embodiment of the invention, the female connecting part has a holding portion extending from the first base. The second has a contracted portion. The holding portion of the first heat sink is suitable to hold the contracted portion.

In one embodiment of the invention, the first base and the first fin assembly are integrally formed.

In one embodiment of the invention, the second base and the second fin assembly are integrally formed.

In one embodiment of the invention, the female connecting part further has a plurality of first positioning holes passing through the female connecting part.

In one embodiment of the invention, the male connecting part further has a plurality of second positioning holes passing through the male connecting part and corresponding to the first positioning holes.

In one embodiment of the invention, the modular heat sink further includes a fixing part provided at the female connecting part of the first base. The fixing part is suitable to fix the first heat sink and the second heat sink. The fixing part includes a body and an elastic element extending from the body. In addition, the elastic element is warped at the first surface of the body. The end of the elastic element has a bolt disposed toward the second surface the body. The bolt is inserted into the corresponding first and second positioning holes to fix the first heat sink and the second heat sink.

In one embodiment of the invention, the material of the fixing part includes metal or plastic.

In one embodiment of the invention, the fixing part further has a bending portion located on the side of the body. The bending portion is bent to allow the bending portion above the elastic element to limit the elastic element.

The male connecting part and the female connecting part whose structures are corresponding are disposed at the two sides of the heat sink, respectively. Therefore, more than two heat sinks may be assembled to form the modular heat sink.

These and other features, aspects, and advantages of the present invention will become better understood with regard to the following description, appended claims, and accompanying drawings.

DETAILED DESCRIPTION OF THE EMBODIMENTS

Figure 1A:
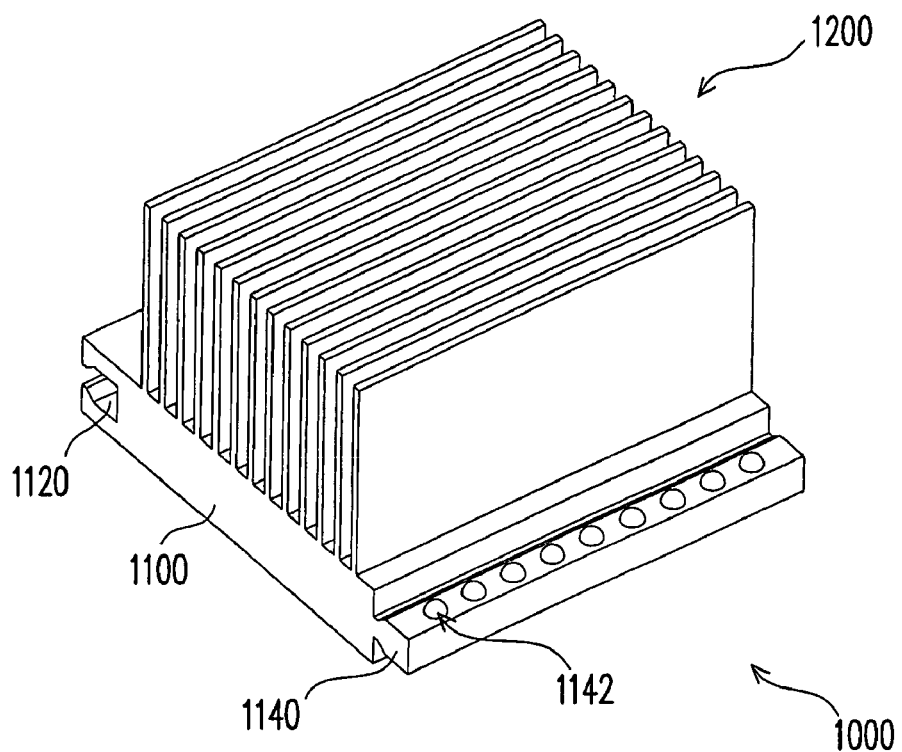
FIGS. 1A, 1B and 1C are schematic diagrams showing a modular heat sink of an embodiment of the invention from three angles.
Figure 1B:
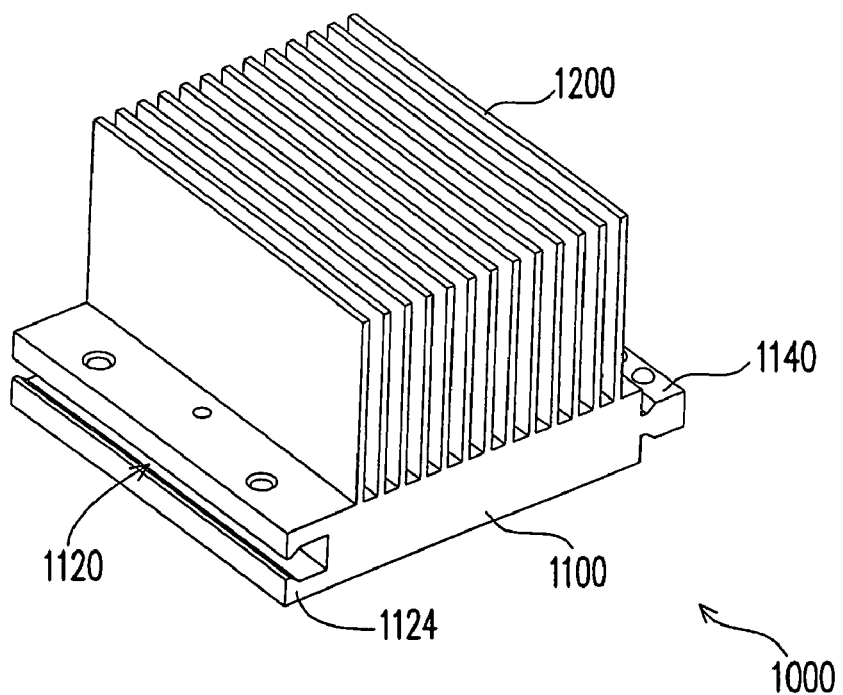
Figure 1C:
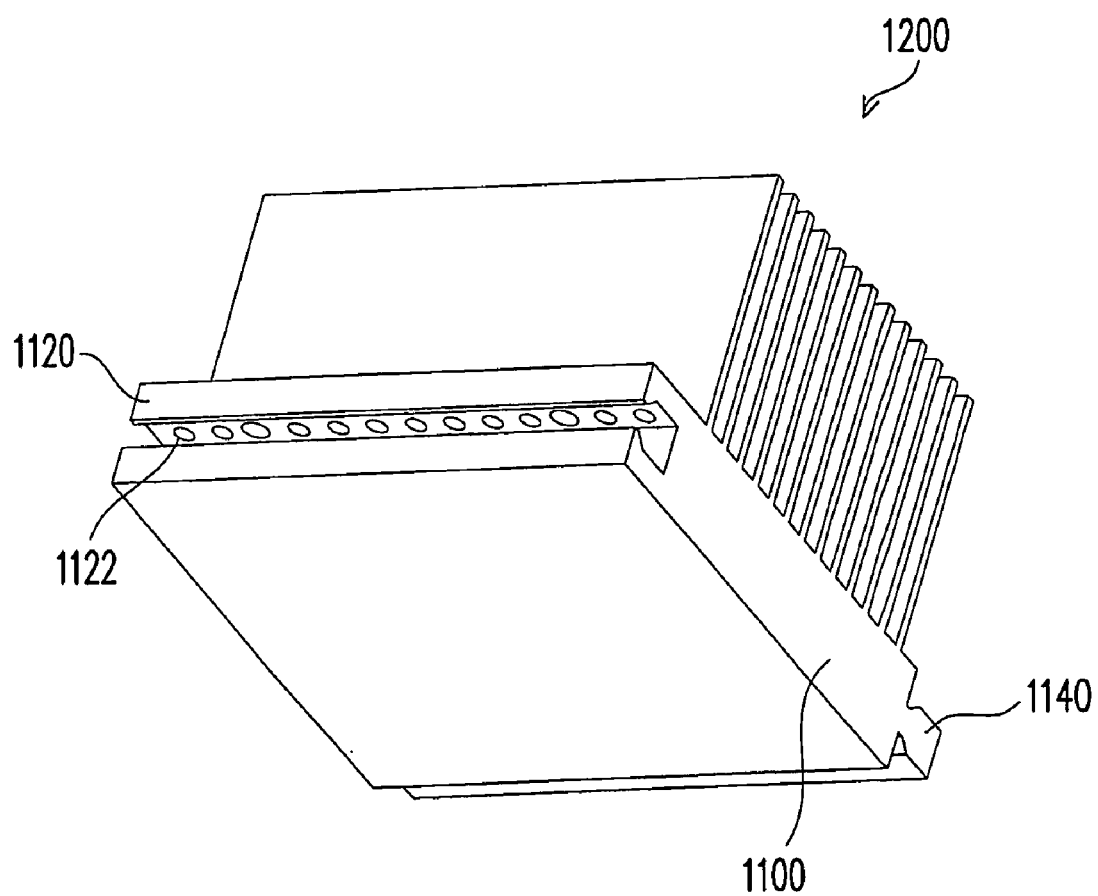
Figure 2A:
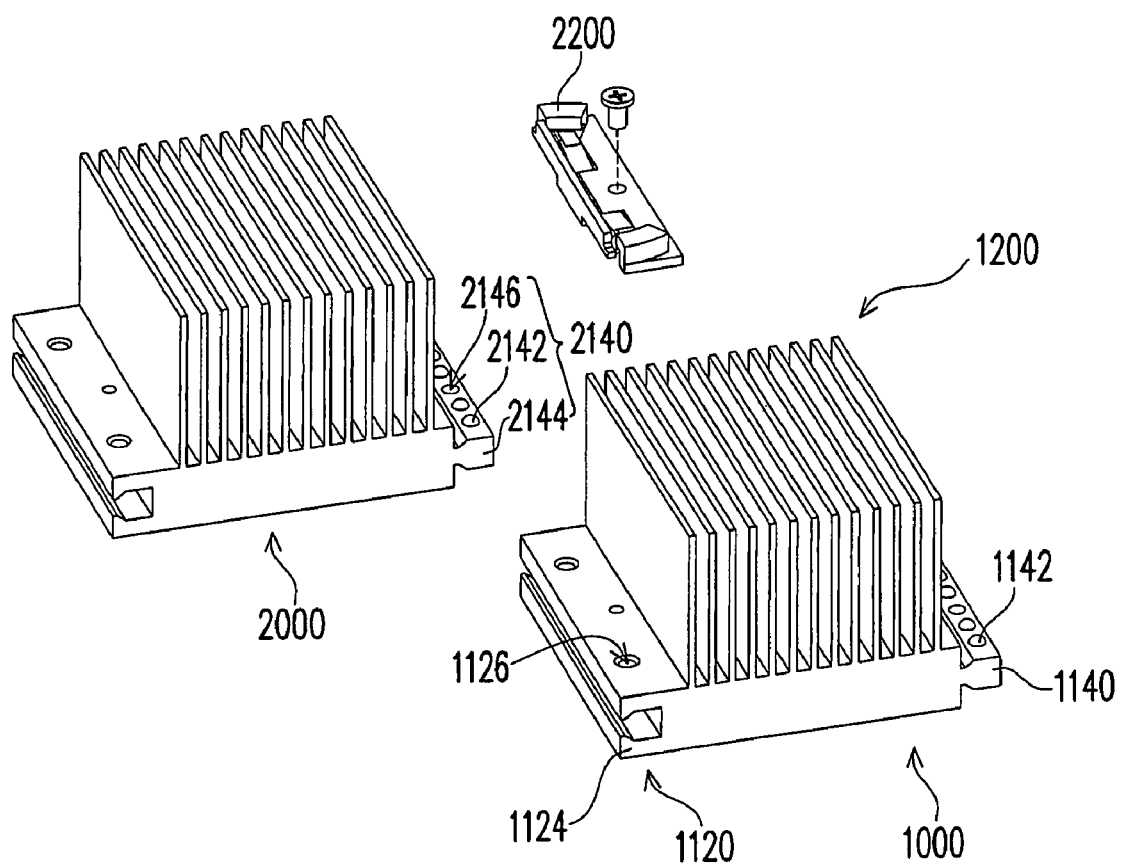
FIG. 2A is a schematic diagram showing two heat sinks which are not assembled.
Figure 2B:
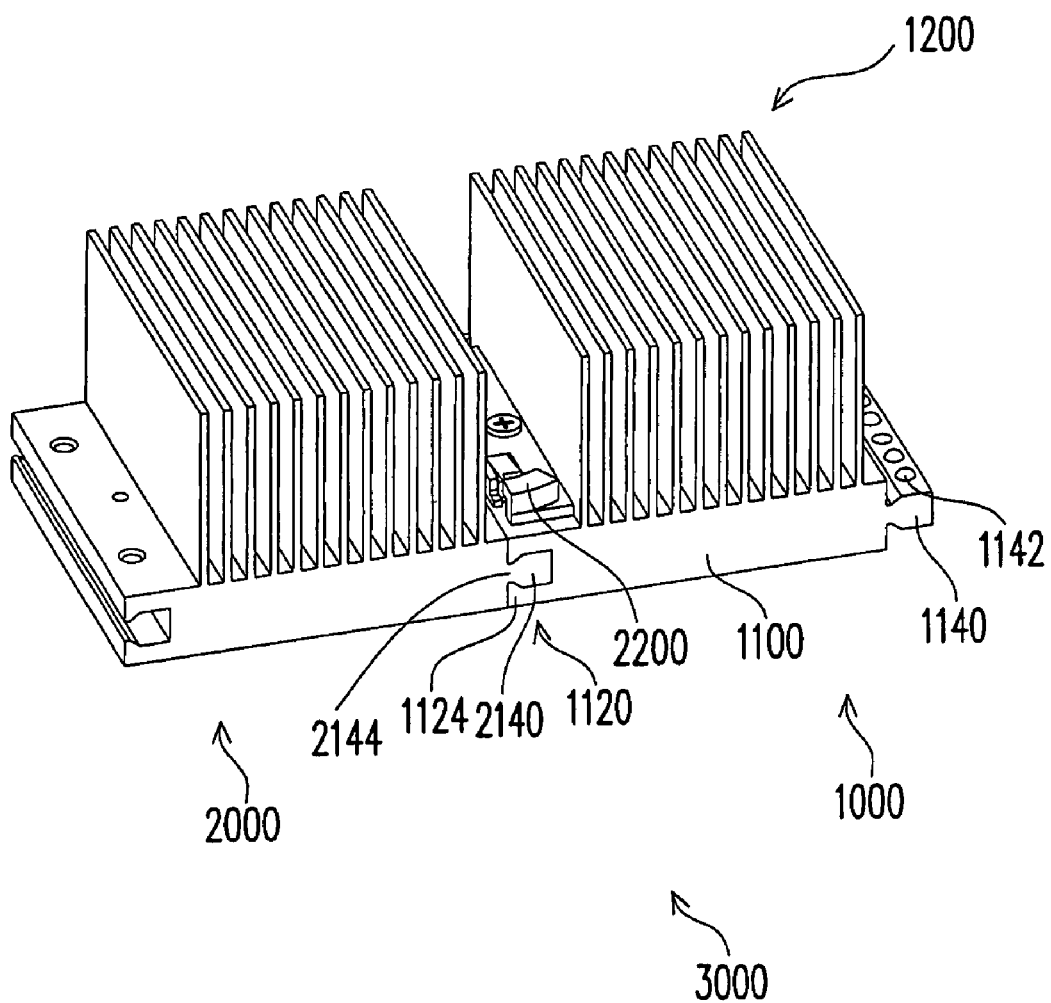
FIG. 2B is a schematic diagram showing the assembled heat sinks in FIG. 2A.

FIGS. 1A, 1B and 1C are schematic diagrams showing the modular heat sink of one embodiment of the invention from three different angles. FIG. 2A is a schematic diagram showing two heat sinks which are not assembled. FIG. 2B is a schematic diagram showing the assembled heat sinks in FIG. 2A. As shown in FIGS. 1A, 1B, 1C, 2A and 2B, a plurality of heat sinks 1000 shown in FIG. 1A are assembled to form the modular heat sink 3000. To facilitate the description, the same heat sinks in FIG. 2A and FIG. 2B are denoted by 1000 and 2000, respectively. In the heat sinks 1000 and 2000, the same element is denoted by the same reference numbers. Therefore, only the structure and the feature of the heat sink 1000 is described. Both the heat sink 2000 and the heat sink 1000 are the heat sinks having the feature of the invention.

The heat sink 1000 includes a base 1100 and a fin assembly 1200. A female connecting part 1120 and a male connecting part 1140 are provided at the two sides of the base 1100, respectively, and the fin assembly 1200 is disposed on the base 1100.

The female connecting part 1120 is a sliding rail, and the male connecting part 1140 is a protrusion extending from the base 1100. The inner side of the female connecting part 1120 has at least a first positioning portion 1122, and the outer side of the male connecting part 1140 has at least a second positioning portion 1142 corresponding to first positioning portion 1122. The number of the first positioning portion 1122 and the second positioning portion 1142 depend on the need of the user. For example, when the first positioning portion 1122 is a dome, the second positioning portion 1142 is a recess; when the first positioning portion 1122 is a recess, the second positioning portion 1142 is a dome. The dome and the recess are used as an example of the embodiment, and relative people in the field or not in the field may easily think of and use other corresponding structures to be the first positioning portion 1122 and the second positioning portion 1142.

Since the base 1100 of the heat sink 1000 shown in FIGS. 1A, 1B and 1C has the female connecting part 1120 and the male connecting part 1140 for coupling with the female connecting part, a plurality of heat sinks 1100 may be assembled together to form the modular heat sink 3000 shown in FIG. 2B.

As shown in 1A, 2A and 2B, two heat sinks 1000 and 2000 may be provided together, and the female connecting part 1120 of the heat sink 1000 is opposite to the male connecting part 2140 of the heat sink 2000.

Afterward, the male connecting part 2140 of the heat sink 2000 is inserted from the edge of the female connecting part 1120 to allow heat sink 2000 to move relatively to the heat sink 1000, and then the male connecting part 2140 slides into the female connecting part 1120.

The female connecting part 1120 has the first positioning portion 1122, and the male connecting part 2140 has the second positioning portion 2142. Therefore, after the male connecting part 2140 slides into the female connecting part 1120, the first positioning portion 1122 is fastened to the corresponding second positioning portion 2142 which it meets, and then fastening sound is made. In addition, a assembler also may feel that whether the first positioning portion 1122 is fastened to the second positioning portion via the hand feeling.

If the male connecting part 2140 does not arrive the predetermined assembling position, the assembler should continue applying force to allow the male connecting part 2140 to move and to allow the second positioning portion 2142 to be fastened with the next first positioning portion 1122. The assembler may easily determine whether the heat sinks 1000 and 2000 are assembled and positioned correctly via the number of the fastening sound or the hand feeling. For the assembler, the heat sinks 1000 and 2000 are easy to be assembled when they are modular.

In addition, to facilitate the recognition, the male connecting part 2140 may have a contracted portion 2144, and the female connecting part 1120 may correspondingly have a holding portion 1124 extending from the first base 1120. In this way, the assembler may easily recognize the male connecting part 2140 and the female connecting part 1120 to avoid mistake in assembling. In addition, when the heat sinks 1000 and 2000 are assembled together, the contracted portion 2144 is held by the holding portion 1124, which increases the closeness between the assembled heat sinks 1000 and 2000.

When the assembler pushes the male connecting part 2140 to the predetermined positioning position, the assembly of the heat sinks 1000 and 2000 is finished, and the heat sinks 1000 and 2000 form the modular heat sink 3000.

As shown in FIG. 2A, to allow the heat sink to be steadily fixed with the heat sink 2000, the modular heat sink 3000 further includes at least a fixing part 2200. The fixing part 2200 fixes the heat sinks 1000 and 2000 together via the close fit in structure such as fastening, or the fixing part 2200 may fix the heat sinks 1000 and 2000 together by locking.

Figure 3A:
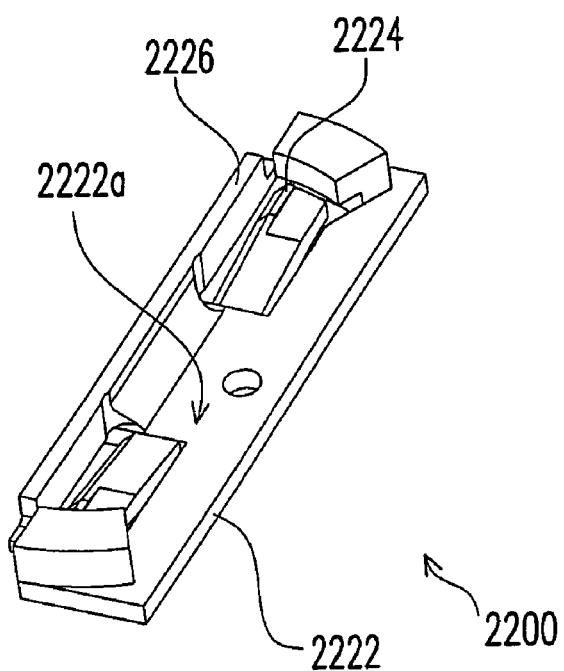
FIG. 3A and FIG. 3B are schematic diagrams showing the fixing part from two angles.
Figure 3B:
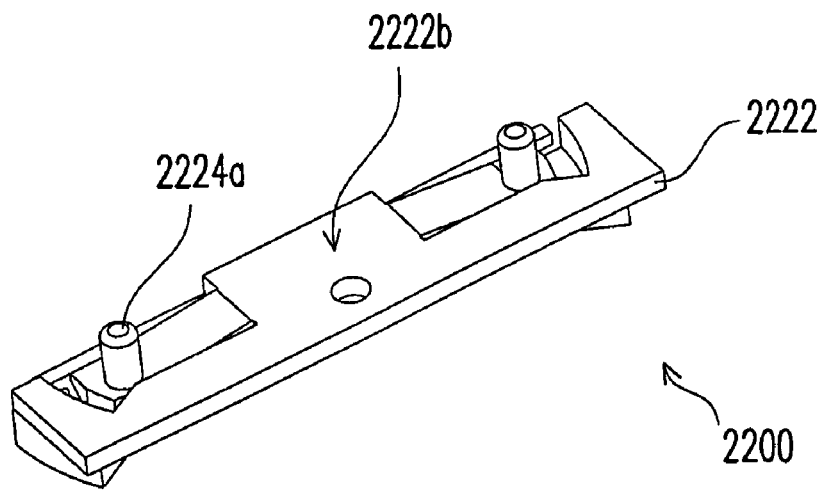

FIG. 3A and FIG. 2B are schematic diagrams showing the fixing part from two angles. As shown in FIG. 2A, FIG. 3A and FIG. 3B, taking the locking mode as example, the fixing part 2200 of the embodiment includes a body 2222 and an elastic element 2224 extending from the body 2222. The material of the fixing part 2200 may be the metal or plastic. The body 2222 is suitable to be provided on the female connecting part 1120, and the elastic element 2224 is warped at the first surface 2222a of the body 2222. The end of the elastic element 2124 has a bolt 2224a, and the bolt 2224a is disposed toward the second surface 2222b of the body 2222. The second surface 2222b faces the female connecting part 1120.

To cooperate with the structure of the fixing part 2200, the structures corresponding to the structure of the fixing part 2200 need to be disposed on the female connecting part 1120 and the male connecting part 2140. In detail, the female connecting part 1120 has a plurality of first positioning holes 1126. Correspondingly, the male connecting part 2140 also has a plurality of second positioning holes corresponding to the first positioning holes 1126.

The first positioning holes 1126 may be arranged with the first positioning portion 1122, and they may pass through the female connecting part 1120. The first positioning portion 1122 may also pass through the female connecting part 1120 or may be a recess which does not pass through the female connecting part 1120. Similarly, the second positioning portion 2142 also may pass through the male connecting part 2140 or may be a recess which does not pass through the male connecting part 2140. One of the first positioning portion 1122 and the second positioning portion 2142 is a recess, and the other is the corresponding dome.

When the fixing part 2200 is used to fix the heat sinks 1000 and 2000, the bolt 2224a of the elastic element 2224 is inserted into the corresponding first positioning hole 1126 and the second positioning hole 2146 to fix the heat sinks 1000 and 2000 together. In addition, to avoid the condition that the resilience of the elastic element 2242 causes the bolt 2224a to incompletely insert to the first positioning hole 1126 and the second positioning hole 2146, a side wall of the body 2222 may be used to form a bending portion 2226. Therefore, after the bolt 2224a is inserted to the corresponding first positioning hole 1126 and the second positioning hole 2146, the assembler pushes the bending portion 2266 to allow the bending portion 2266 to be on the elastic element 2244 to limit the position of the 2224.

In the embodiment, two heat sinks 1000 and 2000 with the same sizes are taken as example. However, the invention is not limited thereto. Briefly, heat sinks with different sizes may be used to form the modular heat sink.

Figure 4:
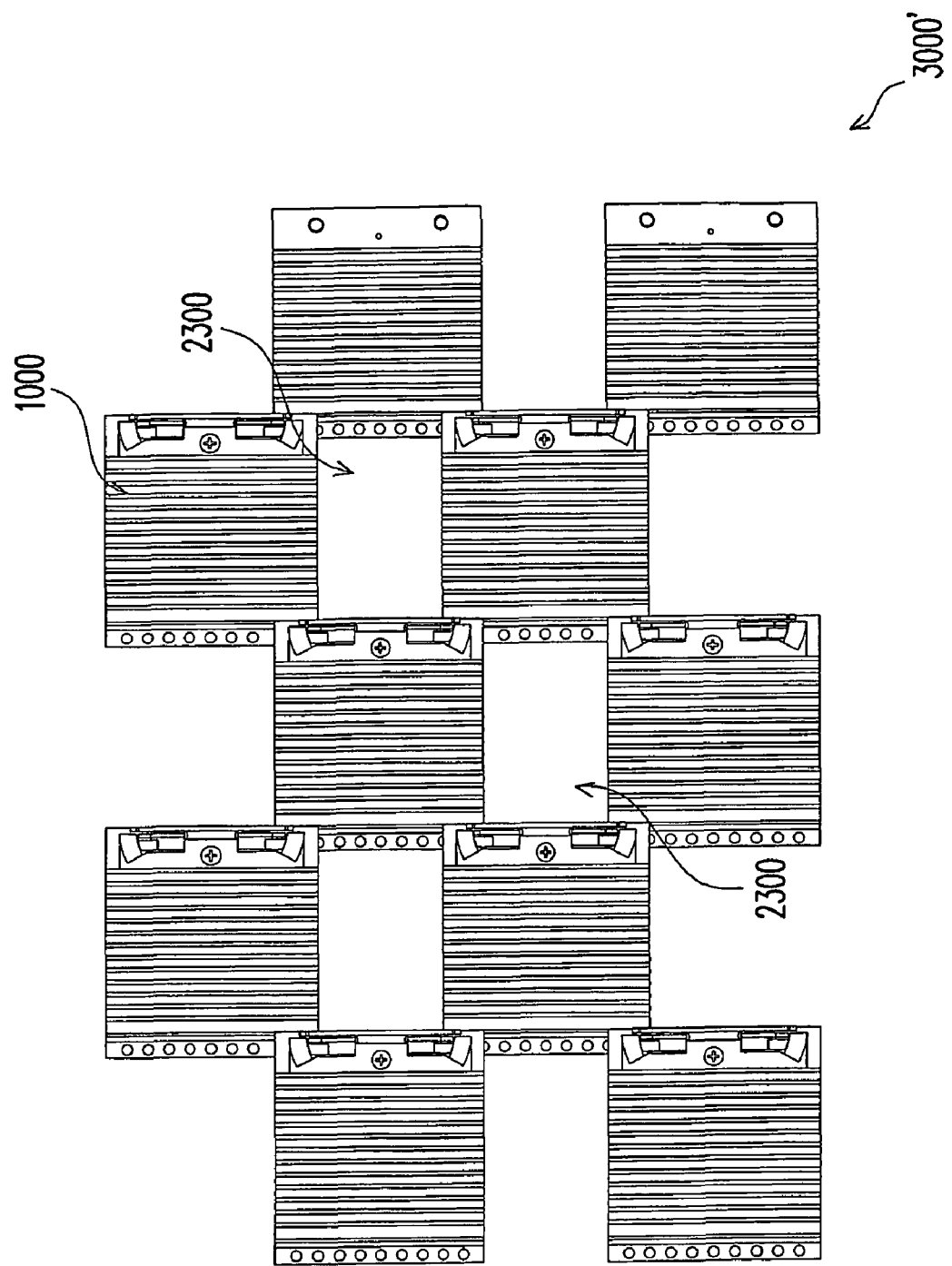
FIG. 4 is a schematic diagram showing a modular heat sink of another embodiment of the invention.

With the assistance of the first positioning portion 1122, the second positioning portion 2142 and the fixing part 2200, the heat sink may be modular to obtain the shape and structure that we need, which depends on the demand. For example, to allow the modular heat sink to have a preferred heat sink effect, a plurality of heat sinks may be assembled to be the modular heat sink 3000' shown in FIG. 4. The space 2300 without the heat sink 1000 in the modular heat sink 3000' is filled with the cold air, and therefore, the heat sink 1000 beside the space 2300 has a preferred heat dissipation effect. Thus, the whole modular heat sink 3000' has a preferred heat dissipation effect. People having ordinary skills in the art may easily think of the shape and splice structure and assemble the heat sink according to the actual need. Therefore, no more example is described in the specification.

To sum up, the heat sink of the invention has a male connecting part and a female connecting part, and then more than two heat sinks may be modular to form a large modular heat sink. In addition, the positioning portions in the male connecting part and the female connecting part helps an assembler to determine whether the heat sinks are assembled and positioned via the sound or the hand feeling in assembling. Furthermore, heat sinks with different sizes may be used to form the modular heat sink, and therefore, the size is selectable in assembling.

The assembling mode, shape and size of the modular heat sink may be determined according to the need such as demand for the heat dissipation effect, actual assembling shape and so on, which is close to the use demand of the client and meets the client-base service.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A modular heat sink comprising:
   a first heat sink comprising a first base and a first fin assembly, wherein the first fin assembly is disposed on the first base, the first base has a female connecting part, and the female connecting part further has a plurality of first positioning holes passing through the female connecting part;
   a second heat sink connected to the first heat sink and comprising a second base and a second fin assembly, wherein the second fin assembly is disposed on the second base, the second base has a male connecting part coupled with the female connecting part, and the male connecting part further has a plurality of second positioning holes passing through the male connecting part and corresponding to the first positioning holes; and
   a fixing part which is suitable to fix the first heat sink and the second heat sink, wherein the fixing part comprises:
      a body; and
      an elastic element extending from the body and warped at a first surface of the body, wherein the end of the elastic element has a bolt toward a second surface of the body, and the bolt is inserted to the corresponding first positioning hole and second positioning hole to fix the first heat sink and the second heat sink.

2. The modular heat sink according to claim 1, wherein the inner side of the female connecting part has a first positioning portion, and the outer side of the male connecting part has a second positioning portion corresponding to the first positioning portion.

3. The modular structure according to claim 2, wherein the first positioning portion is a dome, and the second positioning portion is a recess.

4. The modular heat sink according to claim 2, wherein the first positioning portion is a recess, and the second positioning portion is a dome.

5. The modular heat sink according to claim 2, wherein the female connecting part has a holding portion extending from the first base, and the male connecting part has a contracted portion which is suitable to be held by the holding portion of the first heat sink.

6. The modular heat sink according to claim 1, wherein the first base and the first fin assembly are integrally formed.

7. The modular heat sink according to claim 1, wherein the second base and the second fin assembly are integrally formed.

8. The modular heat sink according to claim 1, wherein the material of the fixing part comprises metal or plastic.

9. The modular heat sink according to claim 1, wherein the body further has a bending portion located at the side of the body, and the bending portion is bent to allow the bending portion above the elastic element to limit the position of the elastic element.

* * * * *